United States Patent
Park et al.

(10) Patent No.: US 8,399,301 B2
(45) Date of Patent: *Mar. 19, 2013

(54) MOUNTING STRUCTURES FOR INTEGRATED CIRCUIT MODULES

(75) Inventors: Sung-Joo Park, Anyang-si (KR); Ki-Hyun Ko, Yongin-si (KR); Young Yun, Yongin-si (KR); Soo-Kyung Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 9 days.

This patent is subject to a terminal disclaimer.

(21) Appl. No.: 13/064,081

(22) Filed: Mar. 4, 2011

(65) Prior Publication Data

US 2011/0165736 A1 Jul. 7, 2011

Related U.S. Application Data

(62) Division of application No. 12/010,138, filed on Jan. 22, 2008, now Pat. No. 7,919,841.

(30) Foreign Application Priority Data

Jan. 25, 2007 (KR) .................. 10-2007-0007720

(51) Int. Cl.
*H01L 21/02* (2006.01)
(52) U.S. Cl. ............ 438/122; 438/125; 257/E23.008; 257/E23.051; 257/E23.065; 257/E23.167; 257/E23.177
(58) Field of Classification Search .......... 438/116–125; 257/E23.008, 51, 65, 167, 177
See application file for complete search history.

(56) References Cited

U.S. PATENT DOCUMENTS

| | | | |
|---|---|---|---|
| 5,164,916 A | 11/1992 | Wu et al. | |
| 5,513,135 A | 4/1996 | Dell et al. | |
| 5,654,653 A | 8/1997 | Coyle et al. | |
| 5,657,456 A | 8/1997 | Gist et al. | |
| 5,687,330 A | 11/1997 | Gist et al. | |
| 5,768,173 A * | 6/1998 | Seo et al. | 365/52 |
| 5,790,447 A * | 8/1998 | Laudon et al. | 365/52 |
| 5,896,346 A * | 4/1999 | Dell et al. | 365/233.1 |
| 5,973,951 A * | 10/1999 | Bechtolsheim et al. | 365/52 |
| 6,130,475 A | 10/2000 | Dell et al. | |
| 6,144,576 A * | 11/2000 | Leddige et al. | 365/63 |
| 6,297,663 B1 | 10/2001 | Matsuoka et al. | |
| 6,335,865 B1 | 1/2002 | Suzuki | |
| 6,377,465 B1 | 4/2002 | Tanaka | |

(Continued)

FOREIGN PATENT DOCUMENTS

JP 07-283836 10/1995

OTHER PUBLICATIONS

Office Action issued in U.S. Appl. No. 13/064,082 dated Jun. 11, 2012.

(Continued)

*Primary Examiner* — Michael Lebentritt
(74) *Attorney, Agent, or Firm* — Harness, Dickey & Pierce, P.L.C.

(57) ABSTRACT

A structure of an integrated circuit module includes a wiring board, a plurality of integrated circuits and at least one terminating resistance circuit. The wiring board has a mounting region on at least one surface thereof. The plurality of integrated circuits are mounted in the mounting region of the wiring board and spaced from one another in a first direction. The at least one terminating resistance circuit is arranged between at least two adjacent integrated circuits, and coupled to an output of a last of the plurality of integrated circuits.

8 Claims, 9 Drawing Sheets

U.S. PATENT DOCUMENTS

| | | | |
|---|---|---|---|
| 6,426,879 B1 * | 7/2002 | Take | 361/766 |
| 6,556,413 B1 | 4/2003 | Rice et al. | |
| 6,680,623 B2 | 1/2004 | Hirai et al. | |
| 6,715,014 B1 | 3/2004 | Johnson et al. | |
| 6,788,560 B2 * | 9/2004 | Sugano et al. | 365/51 |
| 6,839,786 B2 | 1/2005 | Kim et al. | |
| 6,930,900 B2 * | 8/2005 | Bhakta et al. | 365/51 |
| 6,930,903 B2 | 8/2005 | Bhakta et al. | |
| 7,122,886 B2 | 10/2006 | Murayama et al. | |
| 7,269,765 B1 * | 9/2007 | Charlton et al. | 714/710 |
| 7,523,244 B2 | 4/2009 | Liaw et al. | |
| 7,579,687 B2 * | 8/2009 | Szewerenko et al. | 257/707 |
| 7,919,841 B2 * | 4/2011 | Park et al. | 257/678 |
| 2005/0116330 A1 | 6/2005 | Murayama et al. | |
| 2005/0270758 A1 | 12/2005 | Imazato et al. | |
| 2009/0116306 A1 * | 5/2009 | Song et al. | 365/189.09 |
| 2010/0060329 A1 * | 3/2010 | Park | 327/141 |

OTHER PUBLICATIONS

Office Action issued in Japanese Patent Application No. 2008-015165 dated Aug. 7, 2012.

US Notice of Allowance dated Nov. 29, 2010, issued in U.S. Appl. No. 12/010,138.

\* cited by examiner

MOUNTING STRUCTURES FOR INTEGRATED CIRCUIT MODULES

CROSS-REFERENCE TO RELATED APPLICATIONS

This nonprovisional U.S. patent application is a Divisional application of, and claims priority under 35 U.S.C. §120 to, U.S. application Ser. No. 12/010,138, filed on Jan. 22, 2008, now U.S. Pat. No. 7,919,841, which claims priority under 35 U.S.C. §119 to Korean Patent Application no. 10-2007-0007720, filed on Jan. 25, 2007, the entire contents of each of which are incorporated herein by reference.

BACKGROUND

Description of the Related Art

An advanced portable terminal or personal computer may require relatively high speed and/or high capacity main memories, such as, dynamic random access memories. A memory module, capable of functioning as a main memory of personal computer may be based on a plurality of encapsulated memory chips mounted on a wiring board such as a printed circuit board (PCB).

Operating speeds in related art memory modules may be determined by input/output data and an operating frequency of command and address signals. Command and address signals in a memory device may handle a greater load as compared to input/output data, and thus, a maximum operating frequency may be determined by the structure of signal lines employed.

As operating speeds of related art memories increase, signal line topology has changed to accommodate the higher speeds. A relatively more advanced change is a daisy-chain type channel configuration. A daisy-chain type channel configuration is a fly-by type channel coupled with each load through a short-stub. In this example, electrical characteristics of a signal line may be improved by performing impedance matching using terminating resistor(s).

FIG. 1 illustrates a conventional connection structure with command/address lines in a fly-by structure. In FIG. 1, unit signal lines L1 to L3 may be connected sequentially, and unit signal line L3 and a unit signal line L4 may be connected to each other. Unit signal line L5 may be coupled to a DRAM pin 20a. A terminating resistance unit Rtt for impedance matching may be connected to a last pin of the memory device.

As shown in FIG. 1, in a conventional fly-by (daisy-chain) structure, the DRAMs may be connected in series and a terminating resistor is positioned on the signal line. In this example, the terminating resistance is located on an outer portion of memory module. In disposing several passive devices on such an outer portion of the memory module, the memory module may be weaker against exterior impact.

FIGS. 2 and 3 illustrate a conventional double in-line memory module (DIMM) utilizing the fly-by structure of FIG. 1, in which a terminating resistance unit 30 is mounted on an edge portion of a side port of a memory module. Referring to FIGS. 2 and 3, a plurality of DRAM packages 20 to 28 and a terminating resistance unit 30 may be mounted on a wiring board 10. In FIG. 3, the direction of the arrow indicates a channel connection structure for FIG. 1. FIG. 3 depicts a sequential electrical connection of the leftmost DRAM package 20 to the rightmost DRAM package 28. The terminating resistance unit 30 may be coupled to pins of the DRAM package 28. The wiring board 10 may be comprised of glassy epoxy resin sheet having a rectangular shape. Connector pins for connection with a mother board of an electrical system may be formed as shown in a lower part of FIG. 2. The DRAM packages 20 to 28 each encapsulating a DRAM chip may be electrically connected to the wiring board 10 individually through a plurality of leads arrayed at a lower part thereof or through connection balls of a ball grid array BGA. Each of DRAM packages 20 to 28 may have a given width and length as shown in the drawing. The details of a portion 12 where the terminating resistance unit 30 is located is shown in FIG. 4.

As illustrated in FIGS. 1 to 4, devices such as the passive device 32 or terminating resistance unit 30 may be located at an outermost portion of the module when a terminating resistance unit is disposed on the wiring board. As a result, terminating resistance unit may be relatively weak, physically. Furthermore, when the terminating resistance unit is open or short-circuited, a module and/or electrical system employing the module may malfunction. As a result, related art integrated circuit modules are based on a structure including a terminating resistance unit provided together with memory devices located at an edge portion of the memory module. Such integrated circuit modules may have lower fidelity and/or accuracy due to damage.

SUMMARY

Example embodiments relate to integrated circuit modules such as a dynamic random access memories, etc., mounted on a wiring board. For example, example embodiments relate to terminating resistor layouts mounted together with semiconductor devices in an integrated circuit module.

At least one example embodiment provides an integrated circuit module structure capable of substantially reducing damage based on errors in passive devices. At least one other example embodiment provides a terminating resistor layout method and integrated circuit module structure capable of reducing or substantially reducing damage to terminating resistor mounted on integrated circuit modules.

At least one other example embodiment provides a terminating resistor layout structure and a terminating resistor layout method thereof, which may suppress and/or prevent damage caused by dealing error.

According to at least one example embodiment, an integrated circuit module structure may include a wiring board having a mounting region on at least one surface thereof. The mounting region may be formed to have a mounting length in a first direction and a mounting width in a second direction. A plurality of integrated circuit packages may be mounted in the mounting region of the wiring board and may be spaced from one another in the first direction. A terminating resistance circuit may be disposed between any two adjacent integrated circuit packages and may be coupled to an output of a last integrated circuit package among the integrated circuit packages.

At least one other example embodiment provides a structure of integrated circuit module. In at least this example embodiment, a board may have a mounting region on at least one surface. The mounting region may have a first mounting length in a first direction and a first mounting width in a second direction. A plurality of integrated circuits may be mounted in the mounting region of the wiring board. The plurality of integrated circuits may be spaced from one another in the first direction. A terminating resistance circuit may be arranged in a space between two adjacent integrated circuits. The terminating resistance circuit may be coupled to an output of a last integrated circuit among the plurality of integrated circuits.

According to at least some example embodiments, the integrated circuit packages may be a volatile memory device (e.g., DRAM or the like) and may have the same or substantially the same dimension in the first and second directions. The wiring board may be a multi-layer printed circuit board (PCB), and the integrated circuit module may have a fly-by type electrical connection structure.

At least one other example embodiment provides a method of disposing a terminating resistance circuit for a memory module in configuring the memory module by mounting a plurality of memory devices on a wiring board. In an example embodiment of the method, the terminating resistance circuit may be disposed on any one of a plurality of regions between the plurality of memory devices, except an edge region of the wiring board. The terminating resistance circuit may be electrically coupled to an output of an end device among the plurality of memory devices.

According to at least some example embodiments, the integrated circuit module structure and/or the layout method according to at least some example embodiments may reduce or substantially reduce outer physical impact applicable to a terminating resistance unit of the module and/or a handling damage, thereby increasing accuracy and/or fidelity of the module.

BRIEF DESCRIPTION OF THE DRAWINGS

Example embodiments will be apparent from the more particular description of the example embodiments illustrated in the accompanying drawings in which like reference characters refer to the same parts throughout the different views, in which.

DETAILED DESCRIPTION OF EXAMPLE EMBODIMENTS

Figure 1:
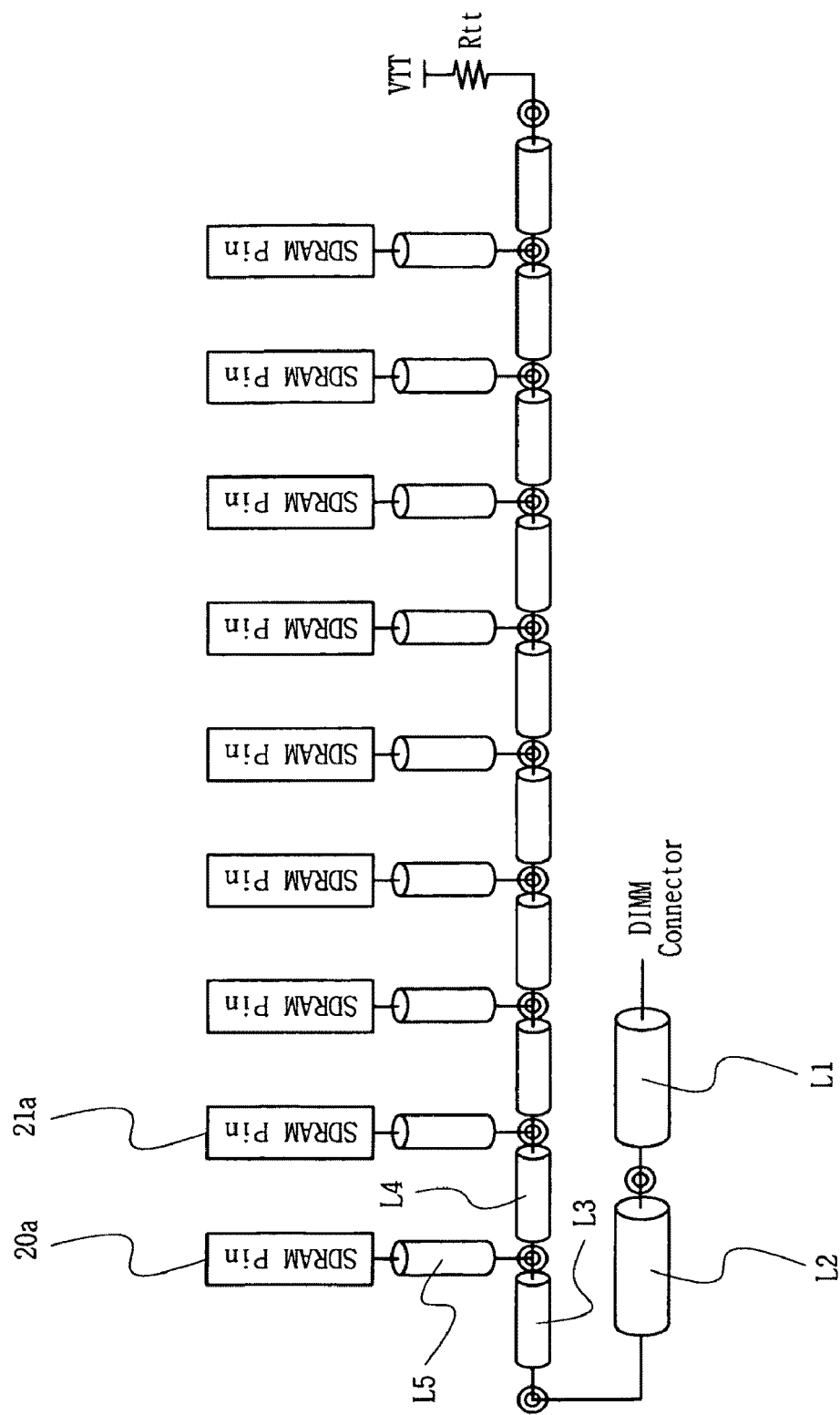
FIGS. 1 to 4 illustrate a structure of a conventional integrated circuit module.
Figure 2:
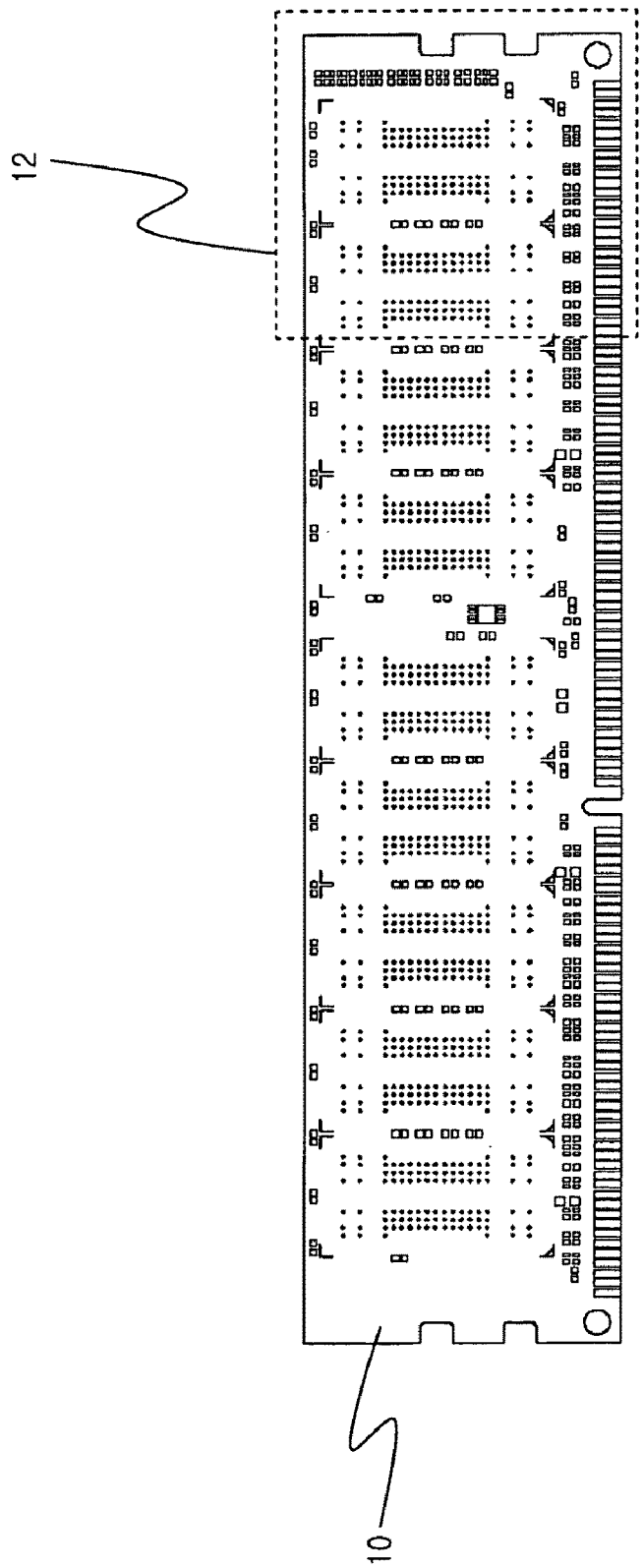
Figure 3:
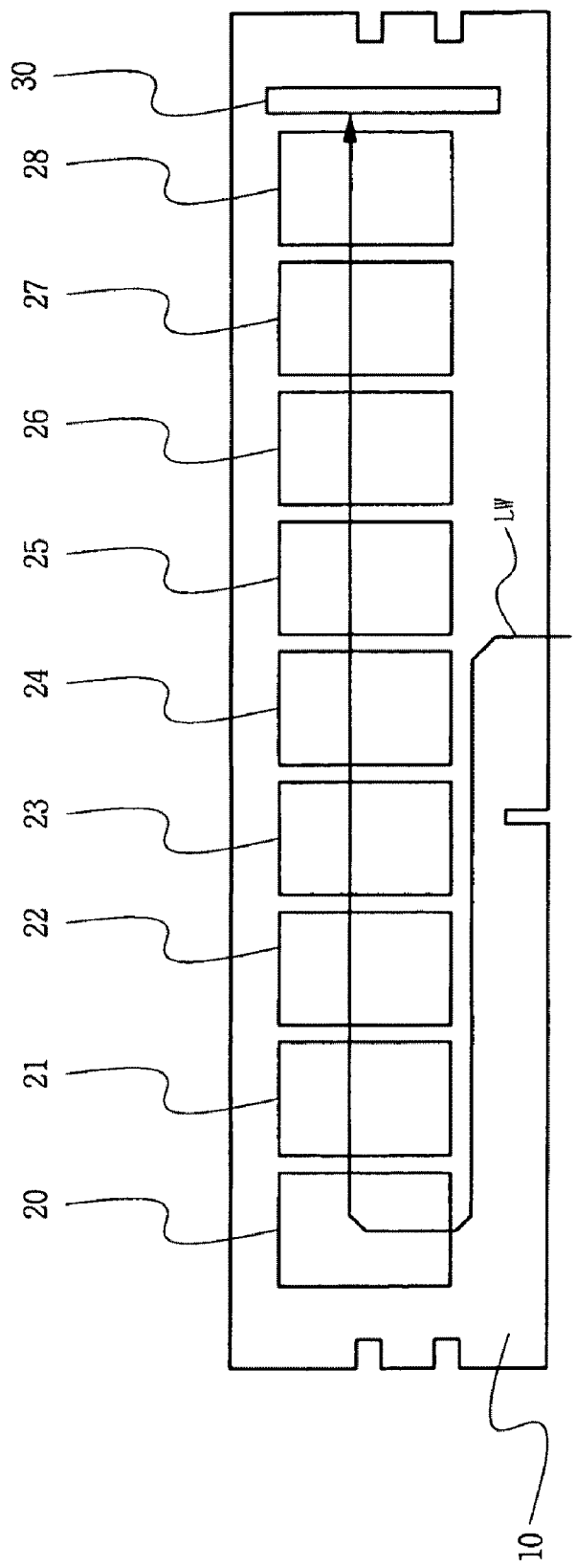
Figure 4:
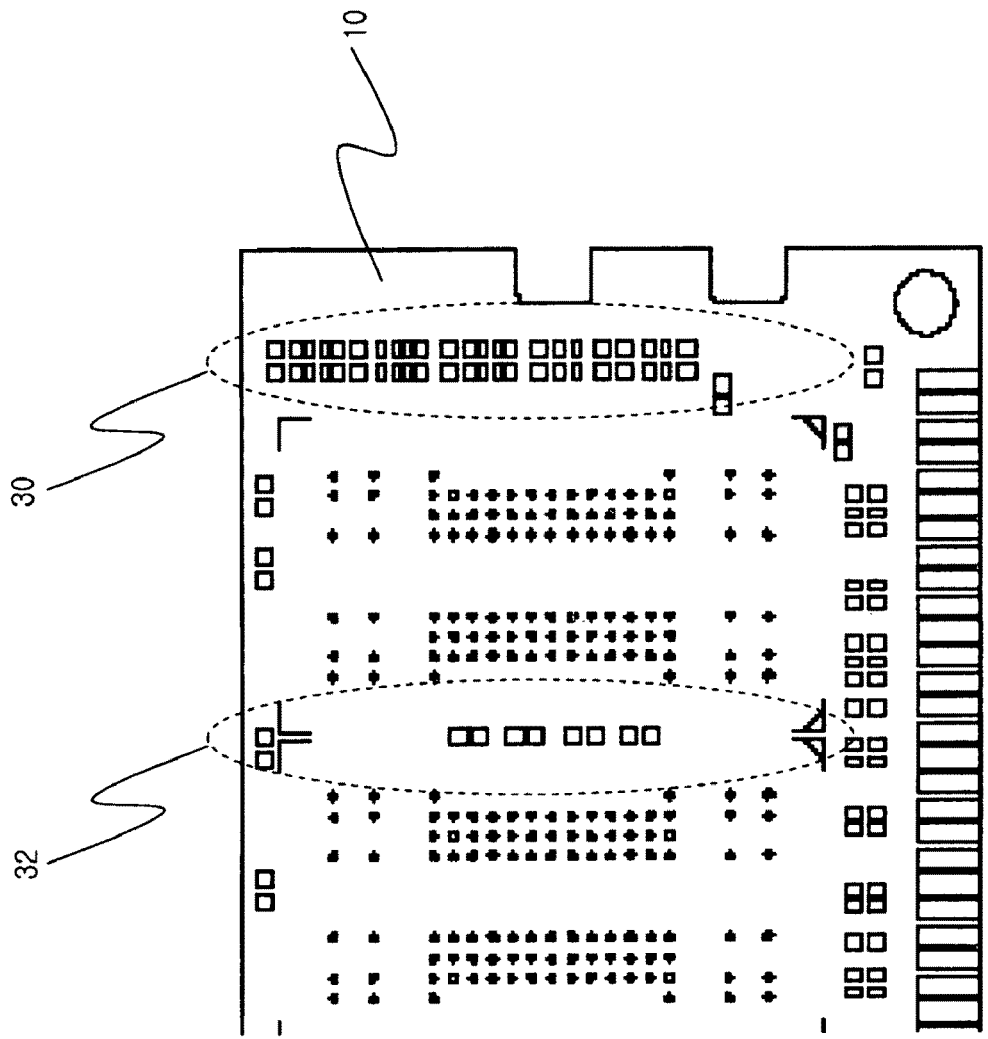

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 5:
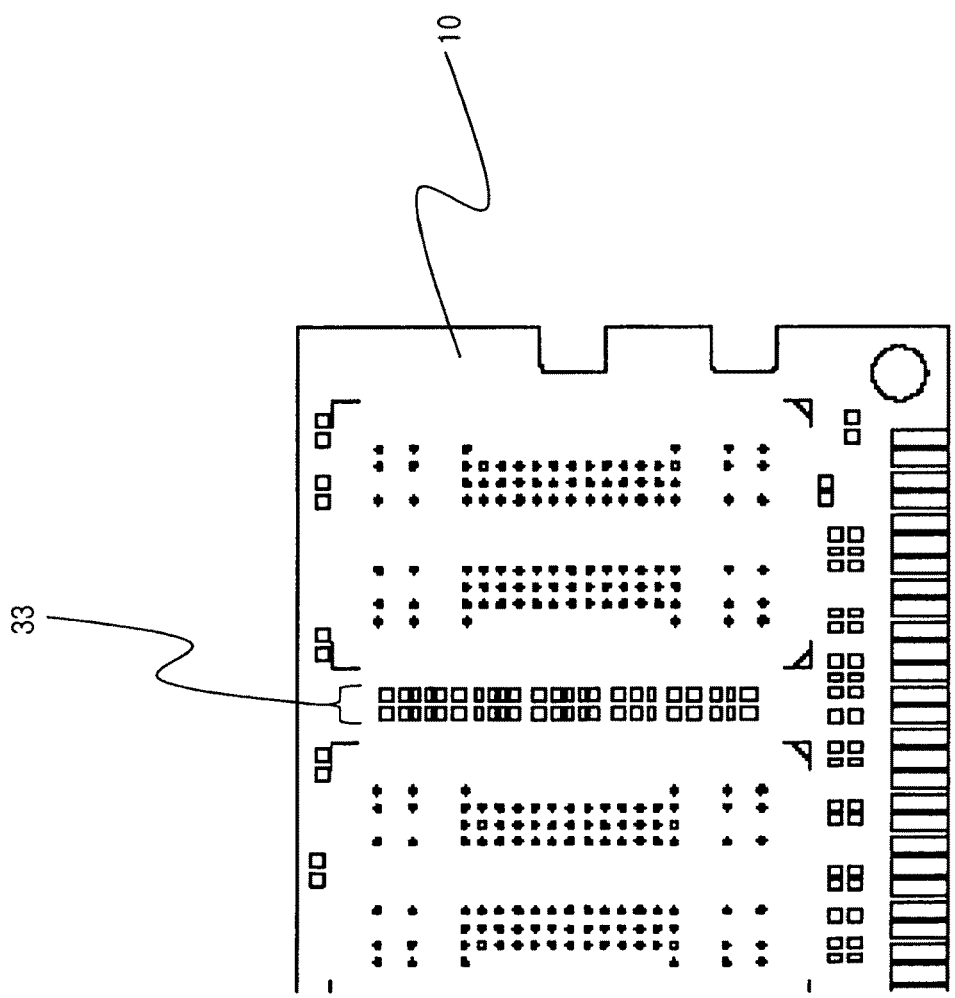
FIGS. 5 to 7 illustrate structures of integrated circuit module according to example embodiments.
Figure 6:
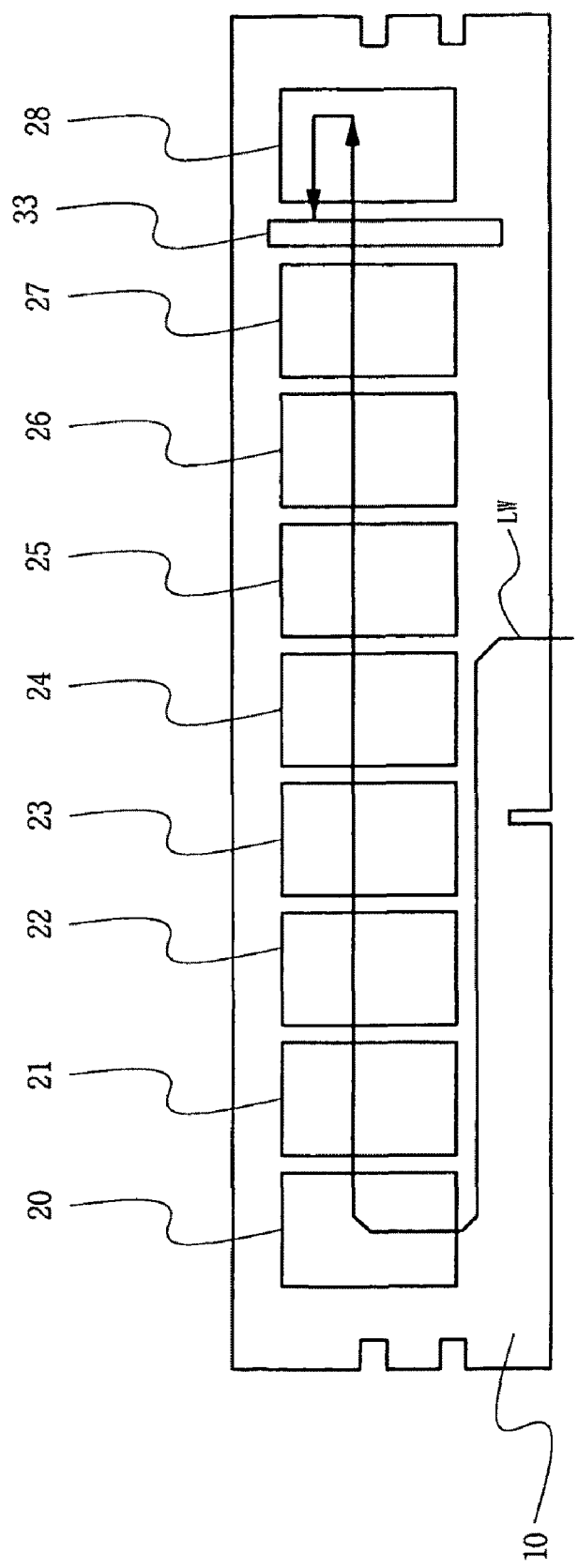
Figure 7:
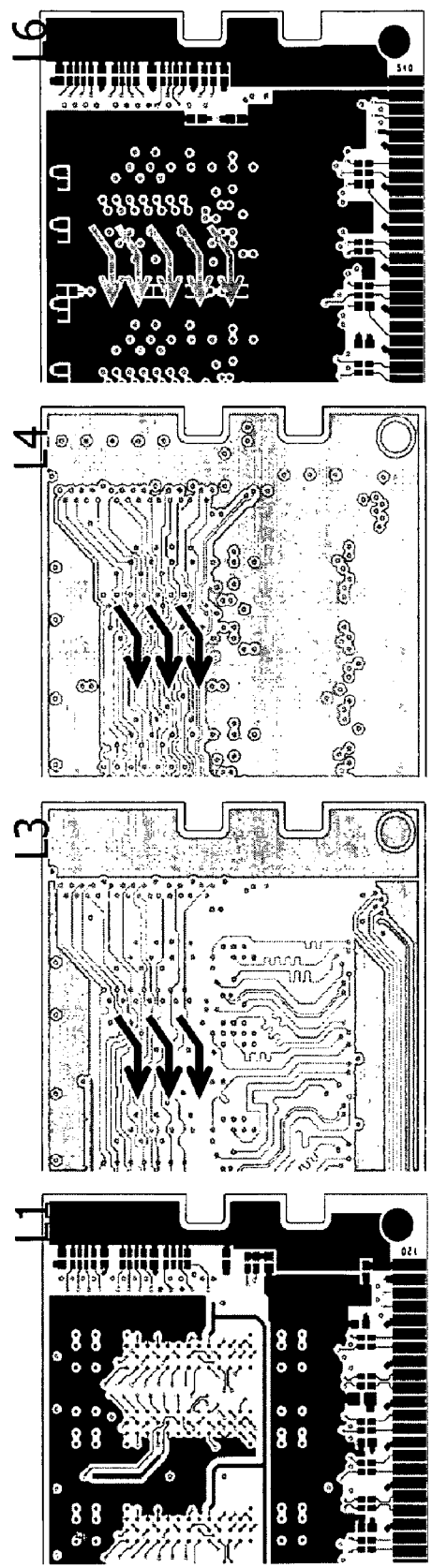
Figure 8:
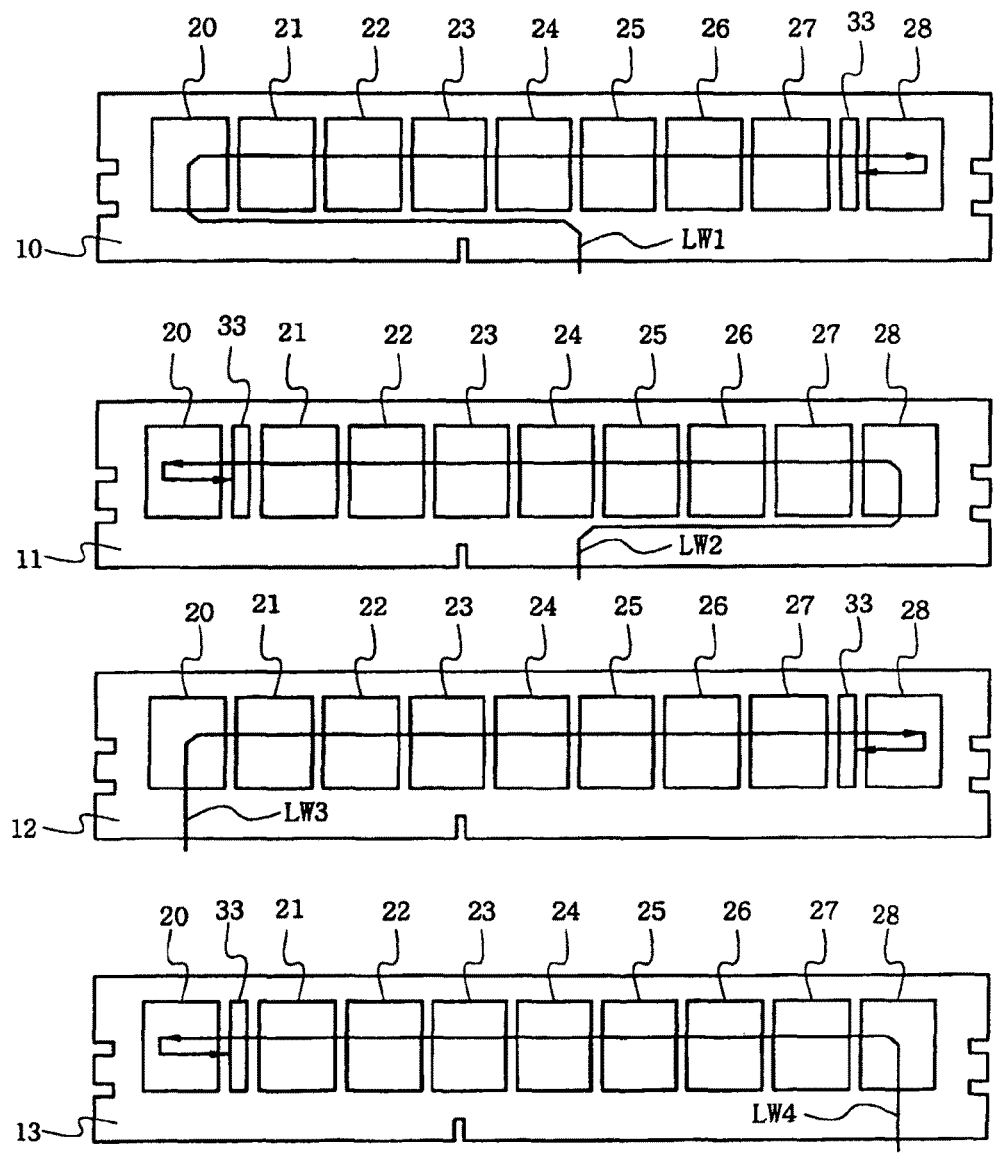
FIGS. 8 and 9 illustrate a layout of a terminating resistance circuit according to example embodiments.
Figure 9:
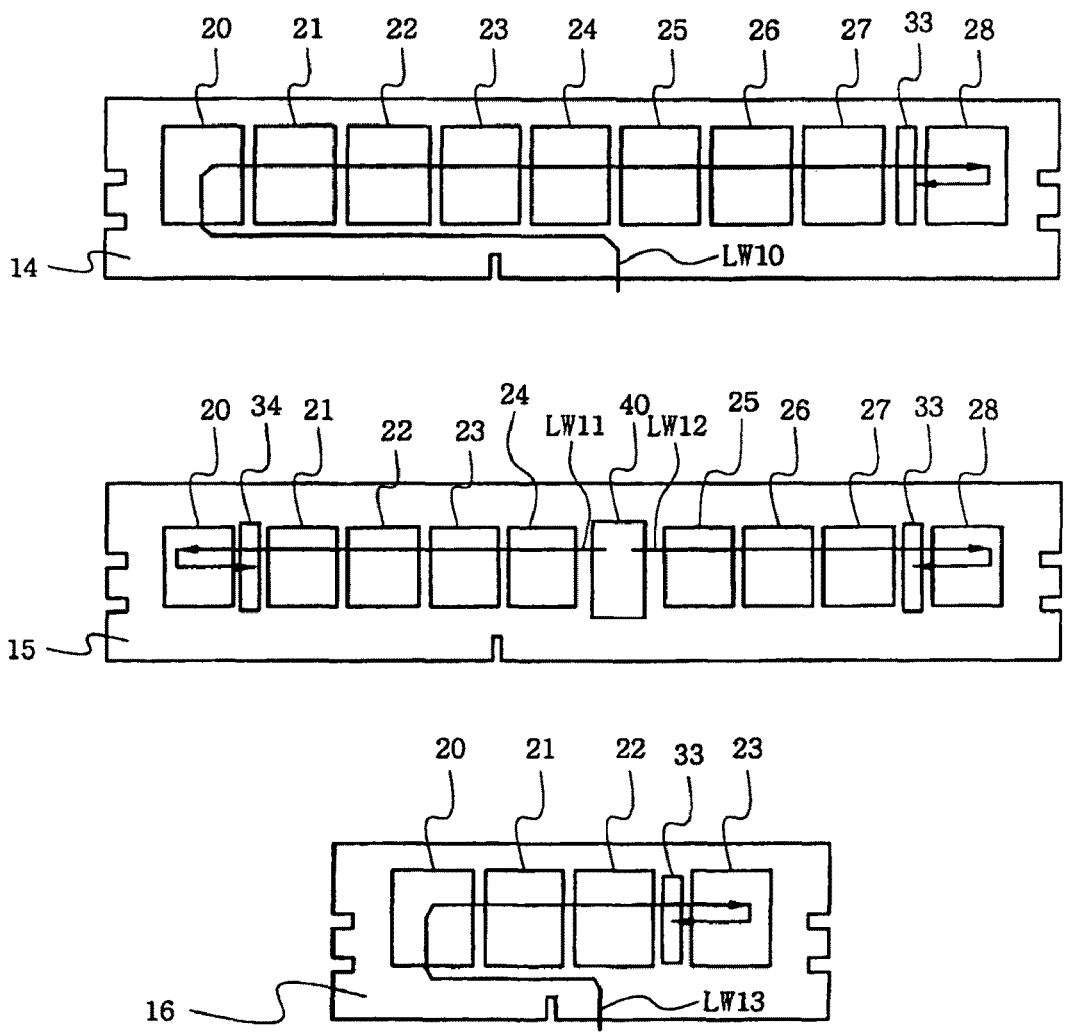

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved. FIGS. 5 to 7 illustrate a structure of integrated circuit module according to an example embodiment. FIGS. 8 and 9 illustrate a layout of terminating resistance according to example embodiments.

Example embodiments may include a terminating resistance unit or circuit disposed in an internal region (e.g., between memory devices), to reduce or substantially reduce damage resulting from, for example, a dealing error on the terminating resistance unit of the integrated circuit module.

Referring to FIGS. 5 and 6, an integrated circuit module may include a wiring board 10 having a mounting region on at least one surface thereof. The mounting region may have a first mounting length in a first direction (also referred to as the length direction) and a first mounting width in a second direction (also referred to as the width direction). The length and width directions ma be perpendicular to one another. The integrated circuit module may further include a plurality of integrated circuit packages 20-28 and a terminating resistance unit or circuit 33. The terminating resistance circuit may include a plurality of passive devices such as resistors or the like.

As shown in FIG. 6, in the wiring board 10 having a mounting region on at least one surface thereof, the plurality of integrated circuit packages 20-28 may be disposed at a first distance from one another in the first direction. In this example configuration, the terminating resistance circuit 33 may be disposed between any two adjacent integrated circuit packages 20-28. For example, the terminating resistance circuit 33 may be arranged between the circuit packages 27 and 28, and may be connected to an output of the last or end integrated circuit package (e.g., 28 of FIG. 6). According to at least this example embodiment, the terminating resistance circuit 33 may be disposed between two adjacent integrated circuit packages (e.g., DRAMs or the like), but may be electrically coupled to the end integrated circuit package (e.g., 28 of FIG. 6).

Each of the integrated circuit packages 20-28 may be a volatile memory device (e.g., a DDR DRAM, or the like) and may have the same or substantially the same dimensions in the first and/or second directions. The wiring board 10 may be a multi-layer printed circuit board, and the integrated circuit module may have a fly-by type structure.

With reference to FIGS. 5 and 6, in arranging a passive device such as terminating resistor between memory devices, the passive device may be better protected from an external, outer impact and/or handling damage. The terminating resistances may have a lower step than that of the memory device packages, and thus, may be better protected from physical impact and/or static electricity. According to at least some example embodiments, the integrated circuit module may have the connection structure of "DRAM→ . . . →DRAM→Terminating Resistor," and be more physically durable. To compensate for conventional, sequential connections, more conductive layers for wiring may be added, but in example embodiments, a wiring structure without added conductive layers is shown in FIG. 7.

FIG. 7 illustrates an example of multi-layer substrate, which may have electrical connections similar or substantially similar to those in FIG. 6, without an added conductive layer. Referring to FIG. 7, a first rank module may have a PCB structure of including a plurality of (e.g., six) layers, which include a plurality of (e.g., four) signal layers and two reference power/ground layers. According to FIG. 7, a round-trip wire may be added to the wiring of the existing two inside layers, and a wire may be added to a sixth layer in which a memory device is not disposed. The conventional art offers a one-way scheme in a via-to-via connection within the inside layer. By contrast in FIG. 7, the round-trip scheme is provided in a via-to-via connection. Consequently, an inside layer of a multi-layer printed circuit board has the round-trip scheme via-to-via connection, and an outer layer has a pin connection of a via-to-memory device. Accordingly, a terminating resistance circuit may be arranged in an internal region without an added conductive layer.

In arranging memory devices on both faces of a mounting board, sides or surfaces of the module (e.g., second rank), an outer layer may be used for wiring of round-trip signal line, and an additional layout to the existing inside layer signal line may be provided to form the wiring shown in FIG. 6. Wiring methods according to at least some example embodiments may be applicable to structures other than those discussed herein. In addition, when a pinout of the module and/or a wiring direction is changed (e.g., left to right, right to left), example embodiments may be applied.

FIGS. 8 and 9 illustrate various layout examples based on a pinout of the module, wiring direction and/or module type. The memory module may have different sizes and/or pinouts, and may have configurable options such as using a buffer device. In FIGS. 8 and 9, arrows LW1 to LW4 and LW10 to LW13 represent channel connection structures of signal lines.

The wiring boards 10 and 11 of FIG. 8 may have a center entry type in which an arrow LW1 of the drawing enters through a center or substantially center portion of the module and passes sequentially through memory devices 20 to 28 and terminating resistance circuit 33. An arrow LW2 may start through a center or substantially center portion of the module and sequentially pass through memory devices 28 to 20 and terminating resistance circuit 33. In wiring board 12, an arrow LW3 of the drawing begins through a left portion of the module and sequentially passes through memory devices 20 to 28 and terminating resistance circuit 33. In wiring board 13, an arrow LW4 begins at a right portion of the module and sequentially passes through memory devices 28 to 20 and terminating resistance circuit 33.

The wiring boards 14, 15 and 16 illustrated in FIG. 9 may be applicable to any or all types of DIMM structures having similar or substantially similar wiring structures, such as, unbuffered structures (UDIMM) in which a buffer device is not disposed, registered modules (RDIMM) having register/phase locked loop (PLL) integrated circuits (IC), and/or fully buffered DIMMs (FBDIMM) using an AMB (Advanced Memory Buffer), a small-sized memory module (SoDIMM: Small outline DIMM), etc. Example embodiments may be applicable to all types of module layout and/or wiring having the same or substantially the same signal line structure.

Referring to FIG. 9, in wiring board 14, arrow LW10 enters through a right center portion of the module and passes sequentially through memory devices 20 to 28 and terminating resistance circuit 33. In wiring board 15, arrows LW11 and LW12 enter through a portion 40 between two adjacent memory devices 25 and 26. The arrow L11 passes sequentially through memory devices 24 to 20 and terminating resistance circuit 34. The arrow L12 passes sequentially through memory devices 25 to 28 and terminating resistance circuit 33. As shown, the structure of the wiring board 15 may include a plurality of terminating resistance circuits 33 and 34, each arranged between two adjacent memory devices. Although shown as arranged between memory devices 20 and 21, and 28 and 29, the terminating resistance circuits may be arranged between any two adjacent memory devices.

In wiring board 16, the arrow LW13 may enter through a center portion and pass sequentially through memory devices 20 to 23 and terminating resistance circuit 33.

As described above, in configuring a memory module by mounting a plurality of memory devices on a wiring board, a terminating resistance may be located between adjacent memory devices, and may be electrically coupled to an output of a last device among the memory devices. Accordingly, an exterior physical impact applied to a terminating resistance circuit of the module and/or handling damage may be reduced or substantially reduced to enhance fidelity of the module.

Example embodiments may be applied to a technique of mounting tape carrier packages TCPs with a given tilt on a mounting surface of a wiring board by using support leads to obtain higher density mounting and/or reduce a thickness of the wiring board. In example embodiments of terminating resistance layouts, terminating resistances may be located in an internal region of the module. Example embodiments may be applied to conventional techniques through an appropriate modulation.

Using example embodiments of structures of integrated circuit modules and/or terminating resistor layout methods, an outer physical impact and/or handling damage may be reduced or substantially reduced. Operation reliability may also be increased.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For example, positions for not only terminating resistances but other module devices may be changed diversely. Accordingly, these and other changes and modifications are seen to be within the true spirit and scope of the invention as defined by the appended claims.

In the drawings and specification, there have been disclosed example embodiments and, although specific terms are employed, they are used in a generic and descriptive sense only and not for purposes of limitation, the scope of the invention being set forth in the following claims.

What is claimed is:

1. A method of arranging a terminating resistance circuit for an integrated circuit module including a plurality of integrated circuits mounted on a wiring board, the method comprising:
   arranging a terminating resistance circuit between at least two adjacent integrated circuits; and
   electrically coupling the terminating resistance circuit to an output of a last of the plurality of integrated circuits.

2. The method of claim 1, wherein each of the plurality of integrated circuits is a memory device.

3. The method of claim 2, wherein the plurality of memory devices are double data rate (DDR) memories.

4. The method of claim 2, wherein the plurality of memory devices have the same memory capacity and package size.

5. The method of claim 1, wherein the last of the plurality of integrated circuits is mounted at a leftmost or a rightmost side of the wiring board in a first direction.

6. The method of claim 1, wherein the wiring board is a multi-layer printed circuit board.

7. The method of claim 1, wherein an inside layer of the wiring board has a round-trip via-to-via connection, and an outer layer of the wiring board has a via-to-memory device pin connection.

8. The method of claim 1, wherein the integrated circuit module is one of an unbuffered structure (UDIMM), a registered module (RDIMM), a fully buffered DIMM (FBDIMM) and a small outline DIMM (SoDIMM).

* * * * *